United States Patent
Hart (10) Patent No.: US 10,041,558 B1
(45) Date of Patent: Aug. 7, 2018

(54) TUNABLE APPARATUS FOR ADJUSTING EFFECTIVE PERFORMANCE OF PARTICLE IMPACT DAMPER

(71) Applicant: TopLine Corporation, Irvine, CA (US)

(72) Inventor: Martin B. Hart, Irvine, CA (US)

(73) Assignee: TopLine Corporation, Irvine, CA (US)

( * ) Notice: Subject to any disclaimer, the term of this patent is extended or adjusted under 35 U.S.C. 154(b) by 0 days.

(21) Appl. No.: 15/727,371

(22) Filed: Oct. 6, 2017

(51) Int. Cl.
    *F16F 7/00* (2006.01)
    *F16F 7/01* (2006.01)
    *H05K 5/02* (2006.01)

(52) U.S. Cl.
    CPC ......... *F16F 7/015* (2013.01); *H05K 5/0217* (2013.01); *F16F 2224/02* (2013.01); *F16F 2230/186* (2013.01); *F16F 2230/36* (2013.01)

(58) Field of Classification Search
    CPC ............... F16F 7/015; F16F 2226/042; F16F 2226/045; F16F 2226/047; F16F 2230/0005; H05K 5/0217
    See application file for complete search history.

(56) References Cited

U.S. PATENT DOCUMENTS

| | | | |
|---|---|---|---|
| 2,667,237 A * | 1/1954 | Rabinow | F16D 37/02 137/909 |
| 3,141,523 A * | 7/1964 | Dickie | F16F 7/01 188/268 |
| 3,871,496 A * | 3/1975 | Wigal | F16F 9/30 188/268 |
| 4,504,044 A * | 3/1985 | Shtarkman | F16F 13/00 188/268 |
| 5,136,470 A | 8/1992 | Sheridon et al. | |
| 6,454,063 B1 | 9/2002 | Osterberg et al. | |
| 6,547,049 B1 * | 4/2003 | Tomlinson | F01D 25/04 188/379 |
| 6,557,752 B1 | 5/2003 | Yacoob | |
| 6,643,221 B1 | 11/2003 | Hsu et al. | |
| 7,461,728 B2 | 12/2008 | Huston et al. | |
| 8,985,935 B2 | 3/2015 | Tan et al. | |
| 9,521,753 B1 * | 12/2016 | Hunt | B65B 5/08 |

(Continued)

FOREIGN PATENT DOCUMENTS

| | | |
|---|---|---|
| CN | 101576138 A | 11/2009 |
| CN | 105937573 * | 9/2016 |
| JP | 2003194142 A | 7/2003 |

*Primary Examiner* — Vishal R Sahni
(74) *Attorney, Agent, or Firm* — Knobbe, Martens, Olson & Bear LLP (57) ABSTRACT

An apparatus for optimizing vibration attenuation of a printed circuit board (PCB) by means of a tunable control for adjusting the volumetric storage capacity, effective mass and travel displacement of a particle impact damper (PID). The apparatus is comprised of a housing with a single or plurality of sealed storage tank(s) containing a payload of tungsten balls (or other materials) with a single or plurality of adjustment screw(s). The volumetric capacity of the storage tank is at maximum when the screw is fully withdrawn from apparatus. The volumetric capacity of the apparatus is reduced when the screw is inserted into the storage tank. The tunable adjustment screw controls the performance of the PID to dampen and attenuate (reduce) the vibration in a printed circuit board without the need to add or remove the payload of tungsten balls inside the particle impact damper.

13 Claims, 10 Drawing Sheets

(56) References Cited

U.S. PATENT DOCUMENTS

| | | | |
|---|---|---|---|
| 2003/0013322 A1 | 1/2003 | Choy et al. | |
| 2006/0175169 A1 | 8/2006 | Or et al. | |
| 2006/0180420 A1* | 8/2006 | Rongong | F16F 7/01 188/378 |
| 2007/0068756 A1 | 3/2007 | Huston et al. | |
| 2010/0320046 A1* | 12/2010 | Provost | F16F 7/015 188/380 |
| 2012/0024646 A1* | 2/2012 | Tsugihashi | F16F 7/015 188/268 |
| 2012/0168271 A1* | 7/2012 | Ryaboy | F16F 7/116 188/379 |

* cited by examiner

TUNABLE APPARATUS FOR ADJUSTING EFFECTIVE PERFORMANCE OF PARTICLE IMPACT DAMPER

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present invention relates generally to vibration damping for printed circuit boards (PCB) and more particularly with a tunable apparatus for adjusting the aggregate volumetric capacity and effective mass of its contents such as a plurality of metal or tungsten particles or other ballast materials contained therein.

Description of the Related Art

Printed circuit board (PCB) assemblies populated with electrical and electronic components experience fatigue, factures, cracks and other general weaknesses after being subjected to excessive vibration environments, especially at the board's fundamental frequency. The fundamental frequency is sometimes referred to as the fundamental mode.

Under excessive vibration conditions, the populated circuit board assembly with components will bend in an uncontrolled manner at frequencies less than hundreds or as much as thousands of times per second. The mechanical and electrical interconnections between the components and the circuit board under vibrating conditions are susceptible to breakage, resulting in catastrophic failure after repeatedly excessive bending, over a period of time lasting perhaps less than a minute or more than several years.

It is preferred to reduce the strength of potentially damaging vibrations in order to extend the life of the PCB assembly. In the prior art a variety of traditional means have been used to mitigate damage caused by excessive vibration by increasing the stiffness of the board, or by using various absorption materials such as foam or rubber bumpers.

Ronald Allen Hunt teaches that vibration can be dampened by using a closed container filled to approximately 90% of capacity with a plurality of metal or tungsten balls, by coupling said container to the surface of a populated circuit card, as disclosed in U.S. Pat. No. 9,521,753 B1. After filling the container with an optimal mass of tungsten balls, the container is closed and sealed to prevent the contents from escaping. Such filled container is known in the art as a particle damper (PD), also known as a particle impact damper (PID).

When the printed circuit board starts vibrating, the tungsten particles inside the cavity of the PID (attached to the surface of the printed circuit board) begins moving and colliding with the walls of the PID cavity storage tank and with each other. This process dissipates energy from the vibrating printed circuit board through nonlinear loss mechanisms, including friction and the exchange of momentum along with the transfer of kinetic energy to heat. When the movement of the tungsten inside the PID cavity storage tank is reversed by the oscillation of the printed circuit board, the tungsten particles slam into the opposite wall and their energy transfer in the opposite direction of the moving tungsten ball's energy. This results in a lower displacement of the printed circuit board where the cavity storage tank of the PID is attached.

Hunt states that the mass of the tungsten balls contained inside the sealed PID is approximately equal to 7% of the combined mass of the printed circuit board populated with components mounted on said board.

The PID may be coupled to the surface of the printed circuit board generally at the geographical center of the board. Alternatively, the PID may be located on the board near the area experiencing the strongest vibration.

In the prior art, the PID is described as a closed, cylindrical metal container selected from a group consisting of aluminum and steel that is coupled to the surface of the circuit board by an adhesive material. The conductive properties of a metal PID container particularly raises special concerns to avoid electrically shorting the PID housing to the highway of circuit traces inherently found on the surface of the printed circuit board.

In the prior art, the permanently (adhesively) adhered stationary structure of the PID container to the surface of the printed circuit board and the closed (sealed) nature of the PID container makes it time consuming, costly and difficult to remove the PID.

In the prior art, after the PID container is permanently attached to the surface of the printed circuit board, it may be impractical or impossible to adjust (tune) the mass of the tungsten particles inside the PID container as a means to achieve the most effective (optimum) reduction in vibration.

In the prior art, removing the PID from the coupled surface of the printed circuit board for the purpose of adjusting, adding or removing tungsten balls to the PID container may require techniques by a highly skilled worker to avoid damaging the PID or to the circuit board.

SUMMARY

Accordingly, there is a need for a simpler and more elegant system for adjusting (e.g., tuning) the volume and mass of tungsten particles (e.g., balls) or other particles such as powers or liquids inside the cavity storage tank of a particle impact damper (PID).

In accordance with one aspect of the invention, an apparatus and method is provided to adjust (e.g., tune) the filled volume capacity, effective mass and travel displacement of tungsten balls inside the cavity of a PID container storage tank without the need to physically add or remove tungsten balls.

In accordance with another aspect of the invention, an apparatus and method is provided that can significantly speed up the process and reduce the cost of adjusting (e.g., tuning) the effective volumetric capacity (e.g., size) of the cavity storage tank inside a PID container.

In accordance with another aspect of the invention, an apparatus and method is provided that permits adjusting (e.g., tuning) the volume capacity, effective mass and travel displacement of tungsten balls inside the cavity storage tank of a PID container without the need to adhesively remove (e.g., decouple) the PID from the surface of the printed circuit board (PCB).

In accordance with another aspect of the invention, an apparatus and method is provided to increase (e.g., enlarge) or decrease (e.g., reduce) the volumetric capacity (e.g., size) of the PID cavity storage tank without altering the exterior size of the PID container.

In accordance with another aspect of the invention, an apparatus and method is provided to repetitively adjust (e.g., tune) the volumetric capacity of the cavity storage tank inside PID container multiple times, as desired.

In accordance with another aspect of the invention, an apparatus and method is provided to adjust (e.g., tune) the volumetric capacity of the cavity storage tank inside PID container in incremental amounts.

In accordance with another aspect of the invention, an apparatus and method is provided comprising a PID container and storage tank of three-piece construction consisting of a removable or non-removable top cover plate, a middle cavity frame and a bottom cover plate.

Alternatively, in accordance with another aspect of the invention, an apparatus and method is provided to comprising a PID container and storage tank of two-piece construction consisting of a removable or non-removable top cover plate, a bottom plate with a cavity storage tank well.

In accordance with another aspect of the invention, an apparatus and method is provided to locate the adjustment (e.g., tunable) controller in a single or a plurality of locations anywhere on the top, sides or the bottom of the PID container.

In accordance with another aspect of the invention, an apparatus and method comprises a single or plurality of threaded holes anywhere on the top, sides or the bottom of the PID container.

In accordance with another aspect of the invention, an apparatus and method comprises a single or plurality of holes (e.g., threaded holes) extending therethrough from the exterior surface of the PID container and exiting into the interior cavity storage tank (e.g., reservoir) of the PID container where the tungsten balls, metal particles, powders or liquids are held.

In accordance with another aspect of the invention, an apparatus and method comprising a single or plurality of movable inserts (e.g., threaded screws, plugs or locking fasteners) movably positioned in the hole (or holes), e.g., threaded holes, anywhere in the PID housing.

In accordance with another aspect of the invention, an apparatus and method comprising a single or a plurality of fasteners such as threaded screws or plugs with a mechanism to turn (e.g., drive) said screw into or out of the threaded hole (or holes) in the PID container.

In accordance with another aspect of the invention, an apparatus and method is provided to reduce the volumetric capacity while the screw or plug is driven (e.g., turned) and enters into the cavity storage tank of the PID container.

In accordance with another aspect of the invention, an apparatus and method is provided to enlarge the volumetric capacity while the screw or plug is removably turned and exits the cavity storage tank of the PID container.

These and other objects, features and advantages of the present invention will become more apparent from the detailed description of the preferred embodiment when read in conjunction with the drawings.

DETAILED DESCRIPTION

Figure 1A:
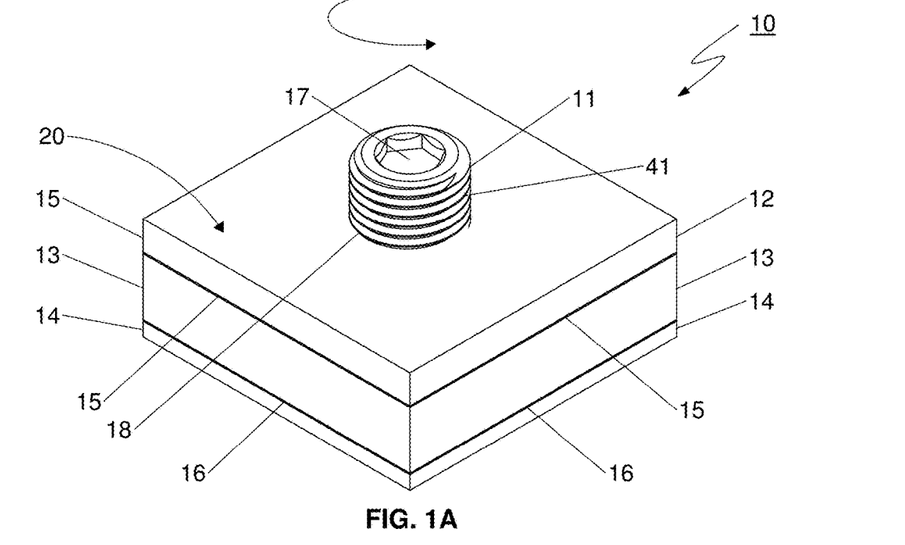
FIG. 1A is a perspective view of one embodiment of the particle impact damper (PID) container with the adjustable screw fully withdrawn from the cavity and FIG. 1B is a perspective view of one embodiment of the particle impact damper (PID) container with the adjustable screw fully inserted into the cavity.
Figure 1B:
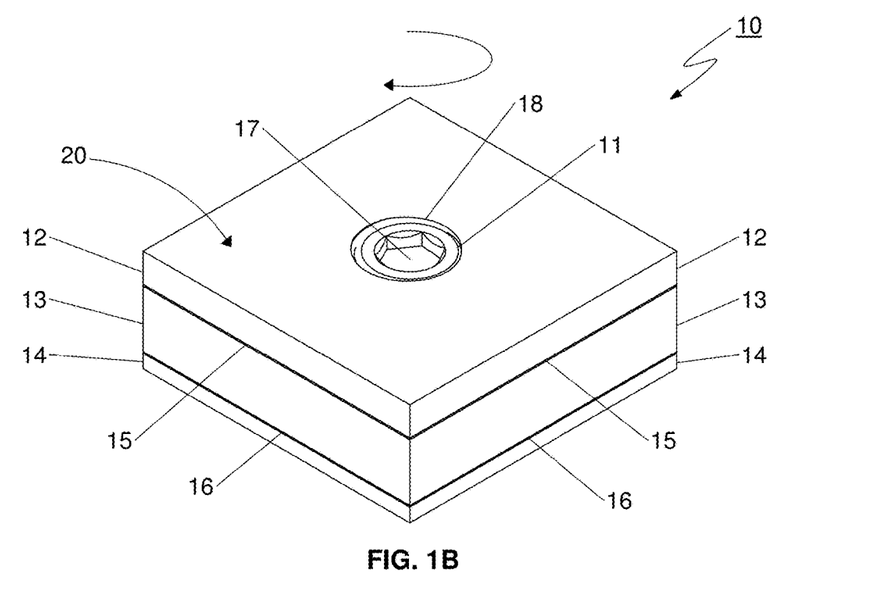
Figure 4A:
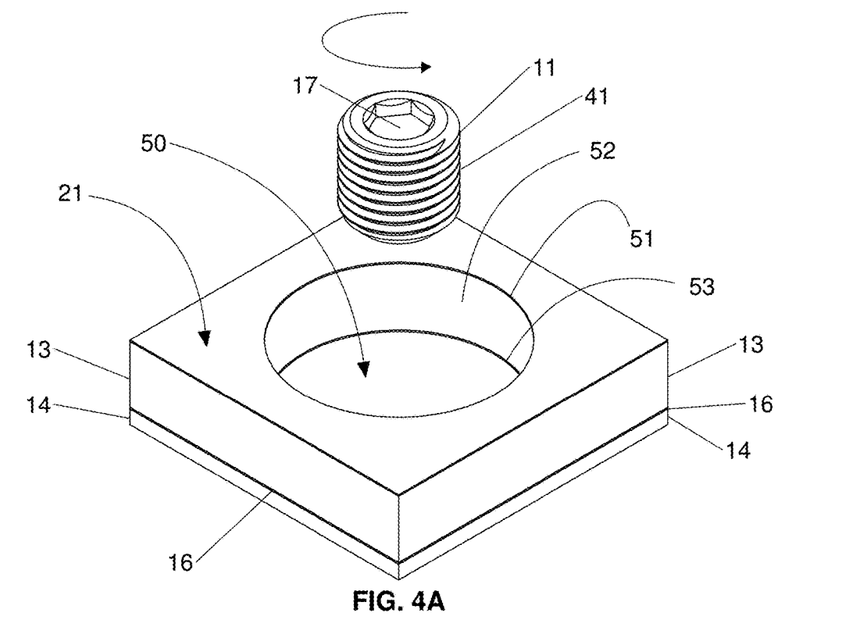
FIG. 4A is a perspective view of the apparatus of FIG. 1A with the top cover plate removed, exposing the cavity storage tank and bottom plate. The adjustable screw is shown fully withdrawn from the cavity. The cavity is shown empty without a plurality of tungsten balls for clarity.
Figure 4B:
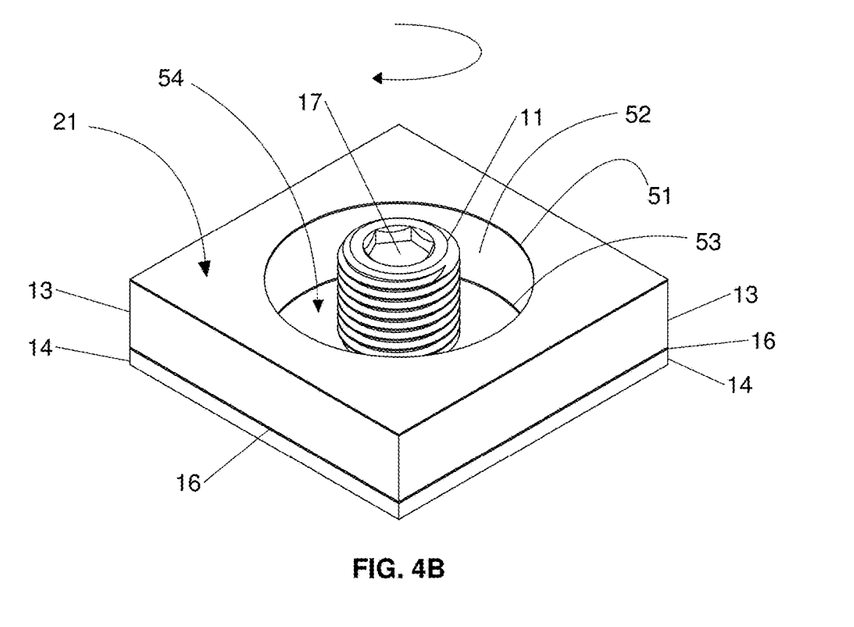
FIG. 4B is a perspective view of the apparatus of FIG. 1B with the top cover plate removed, exposing the cavity and bottom plate. The adjustable screw is shown fully inserted into the cavity. The cavity is shown empty without a plurality of tungsten balls for clarity.
Figure 5A:
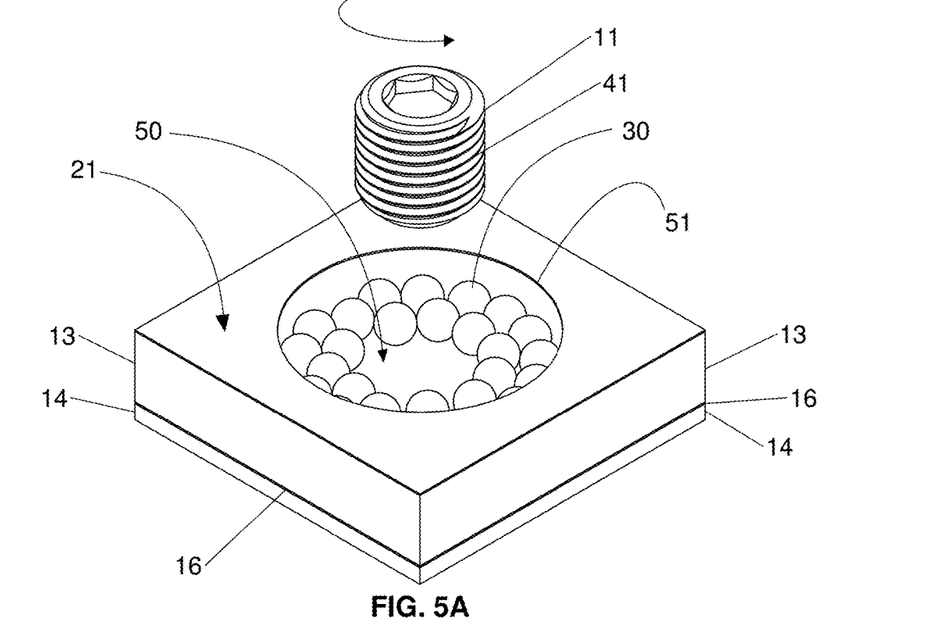
FIG. 5A is a view of the apparatus of FIG. 4A shown filled with a plurality of tungsten balls.
Figure 5B:
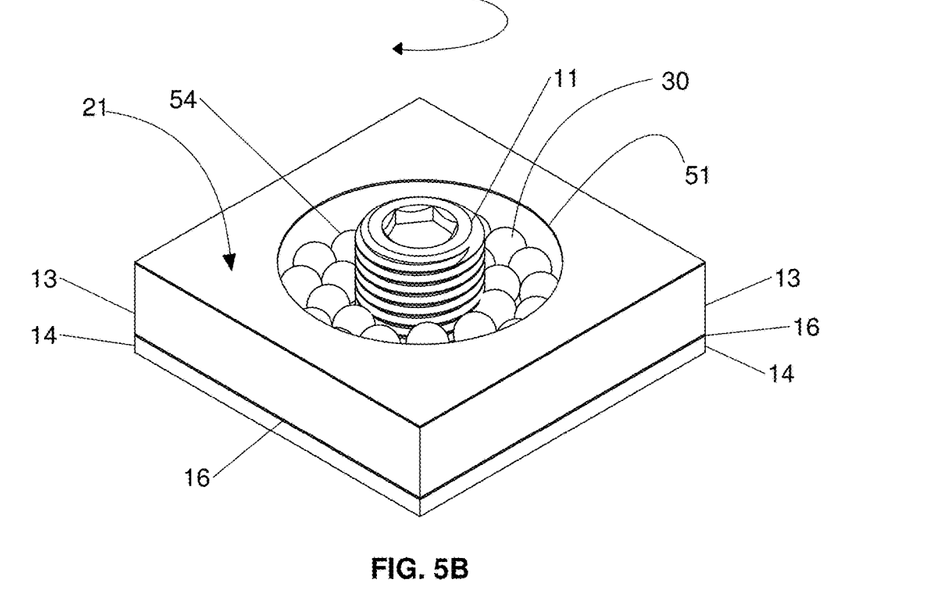
FIG. 5B is an exploded view of the apparatus of FIG. 4B shown filled with a plurality of tungsten balls for clarity.
Figure 6:
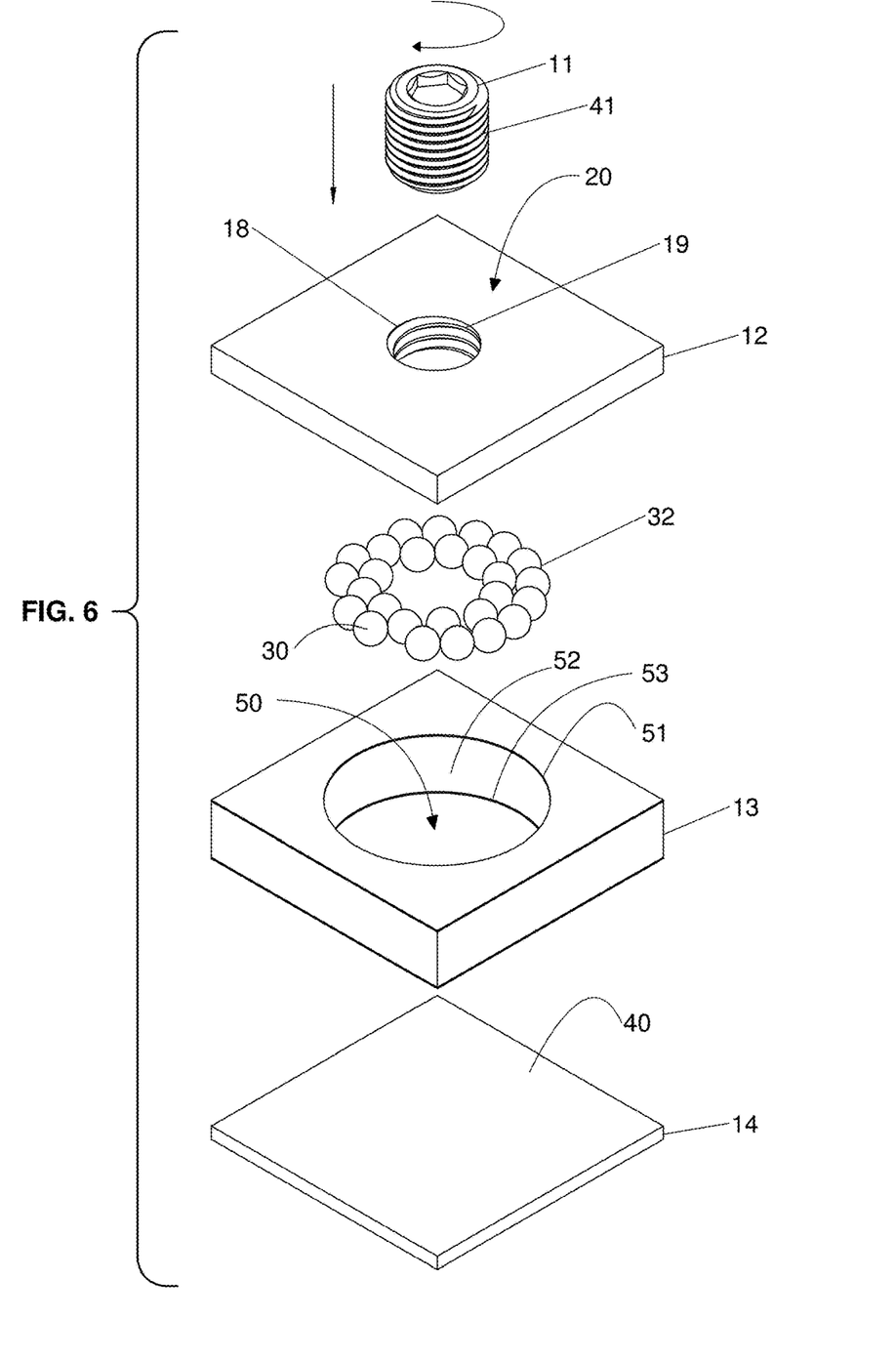
FIG. 6 is an exploded view of FIG. 1A.
Figure 7:
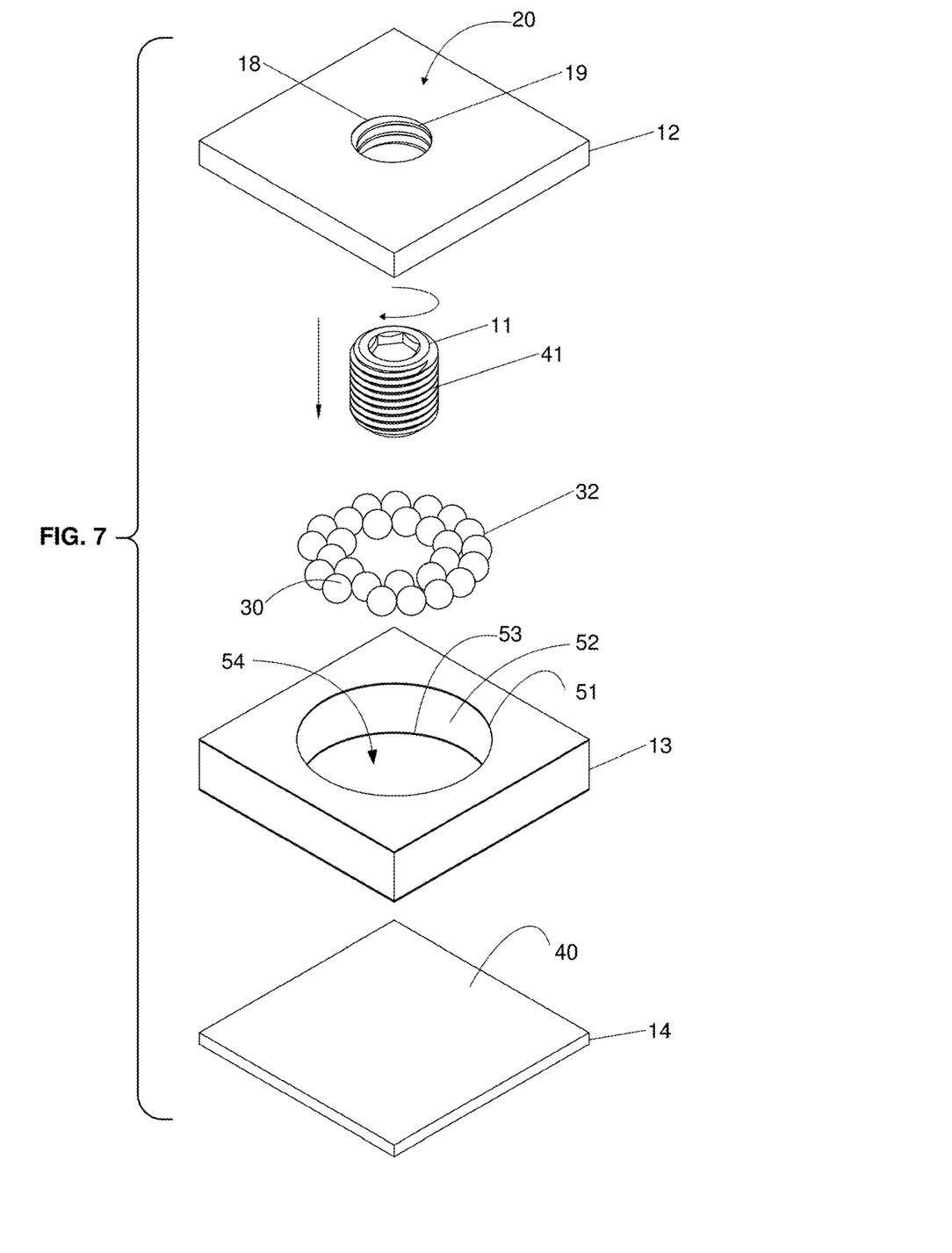
FIG. 7 is an exploded view of FIG. 1B.

Referring first to FIGS. 1A and 1B, is an apparatus, known as a particle impact damper (PID), generally designated at 10, that can hold one or more (e.g., a plurality of) particles 30 (see e.g., FIGS. 5A, 5B, 6 and 7). Optionally, the particles 30 can be made of tungsten. Alternatively, the particles 30 can be made of other suitable materials (e.g., other suitable metals, ceramics, and plastics etc.). Optionally, the particles 30 can be spherical in shape. Alternatively, the particles 30 can have other suitable shapes (e.g., ovoid, diamond, cylindrical, etc.). The particles 30 can optionally be arranged in any random array pattern 32 within the PID 10, as shown in FIG. 6 and FIG. 7. The particles 30 are housed in a storage chamber 50 in the PID 10, as shown for example in FIGS. 4A, 5A and 6A.

Figure 9A:
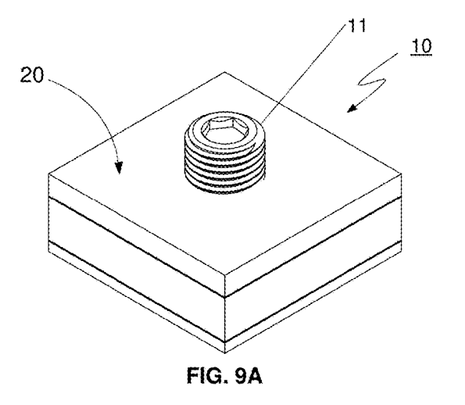
FIG. 9A is square shaped PID container with a single adjustable screw.
Figure 9B:
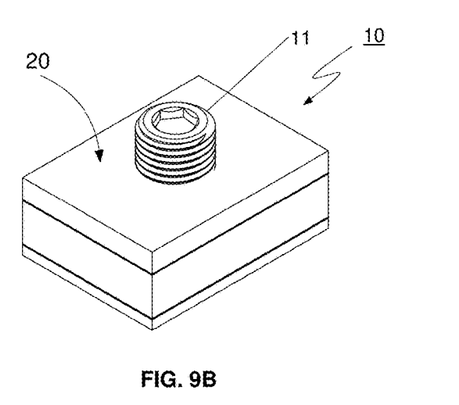
FIG. 9B is a rectangular shaped PID container with a single adjustable screw.
Figure 9C:
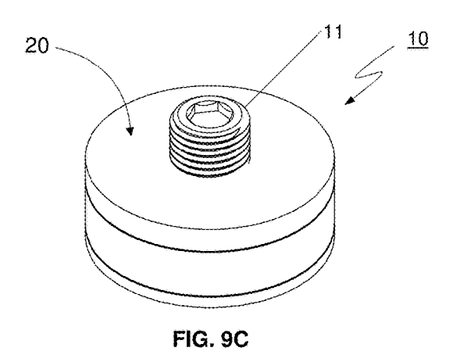
FIG. 9C is a cylindrical shaped PID container with a single adjustable screw.
Figure 9D:
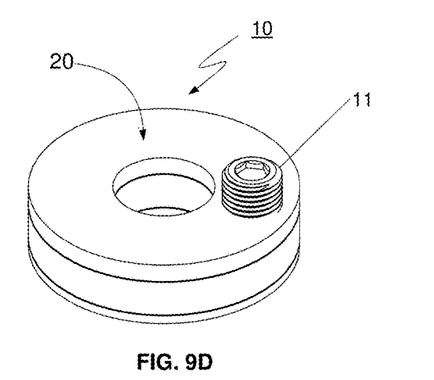
FIG. 9D is a toroidal shaped PID container with a single adjustable screw.
Figure 10A:
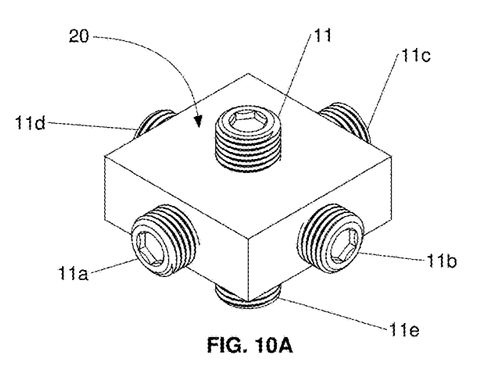
FIG. 10A is similar to FIG. 9A with a plurality of adjustable screws.
Figure 10B:
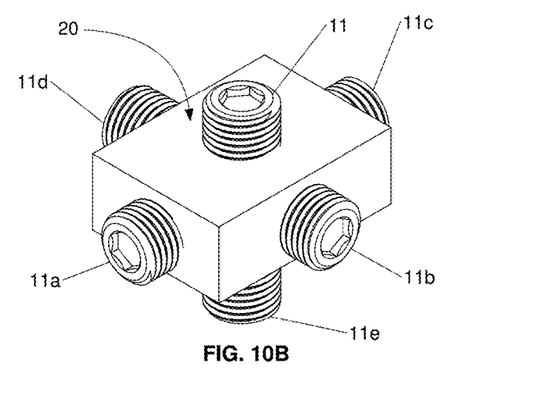
FIG. 10B is similar to FIG. 9B with a plurality of adjustable screws.
Figure 10C:
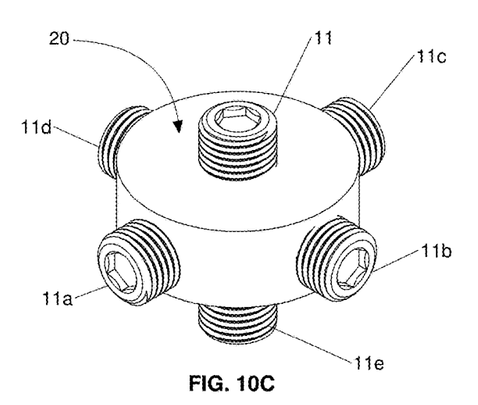
FIG. 10C is similar to FIG. 9C with a plurality of adjustable screws.
Figure 10D:
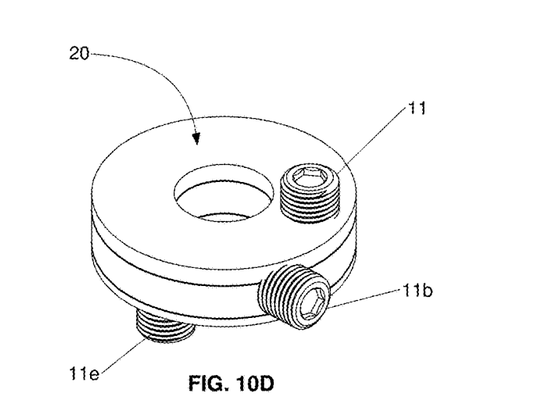
FIG. 10D is a toroidal shaped PID container with a plurality of adjustable screws.

The apparatus 10 can be any suitable shape, such as square (e.g., a cube with a side surface that is a square) as shown in FIG. 9A, rectangular cuboid (e.g., cuboid with a side surface that is a rectangle) as shown in FIG. 9B, cylindrical as shown in FIG. 9C, toroidal as shown in FIG. 9D, or any other suitable shape or combination of shapes. The PID 10 can optionally include a top plate 12, a middle plate 13 and a bottom plate 14. Optionally, one or more of the top plate 12 and bottom plate 14 can be coupled to the middle plate 13. Alternatively, one or both of the top plate 12 and bottom plate 14 can form a single piece (e.g., monolithic, with no seams) with the middle plate 13.

A single or plurality of movable inserts, such as adjustment screws, 11, 11a, 11b, 11c, 11d or 11e that can be removably coupled to any one or a plurality of sides on apparatus 10 as shown in FIGS. 10A, 10B, 10C and 10D. The one or more particles 30 can optionally be made of tungsten, another suitable metal, powder or any other suitable material in the apparatus 10, as discussed further below. The sectional view of particles 30 is shown FIGS. 3A, 3B, 8A and 8B. The top plate 12 of apparatus or PID 10 is generally designated in FIGS. 1A, 1B, 2A, 2B, 3A, 3B, 6, 7, 8A and 8B.

FIGS. 1A, 1B, 4A, 4B, 5A, 5B, 6, 7, 9A, 9B, 9C and 9D shows a single movable insert, e.g., adjustment screw 11, that can be removably coupled to the apparatus 10. The adjustment screw head (slot) 17 designated in FIG. 1A, 1B, 4A or 4B may have any suitable shape, size, design, style or material and sized to couple to a tool (e.g., Allen wrench, screw driver, Philips screw driver) to movably adjust the adjustment screw. The screw threads 41 in FIGS. 1A, 4A, 5A, 6 and 7, can be of any number, style, fine, course, depth or composition. Though the figures show the movable inserts as adjustment screws 11, other suitable movable inserts can be used, such as a movable plunger that extends into the holes 18.

FIGS. 10A, 10B, 10C and 10D shows a single or plurality of movable inserts, e.g., adjustment screws, 11, 11a, 11b, 11c, 11d or 11e that can be removably coupled to any one, all or a plurality of sides (e.g., side walls) on apparatus 10. The single or plurality of adjustment screws 11, 11a, 11b, 11c, 11d or 11e can be located grouped together or distributed as preferred.

FIGS. 2A, 2B, 3A, 3B, 8A and 8B shows a sectional view of a single adjustment screw 11 that can be removably coupled to the apparatus 10. The sectional view of screw head (slot) 17 may have any suitable shape, size, design, style or material. The sectional view of screw threads 41 in FIGS. 2A, 3A and 8A can be of any number, style, fine, course, depth or composition.

A hole 18 (e.g., tapped hole) shown in FIGS. 1A, 1B, 6 and 7 in top plate 12 can have threads 19 shown in FIGS. 6 and 7 that corresponds to screw threads 41 in the adjustment screw 11.

A sectional view of hole 18 (e.g., tapped hole) in top plate 12 with threads 19 is shown in FIGS. 2A, 2B, 3A, 3B, 8A and 8B that corresponds to screw threads 41 in the adjustment screw 11. The top plate 12 can have a top surface 20 that is optionally planar (e.g., flat).

The top plate 12 shown in FIGS. 1A, 1B, 6 and 7 is optionally coupled to middle plate 13 in FIGS. 1A, 1B, 4A, 4B, 5A, 5B, 6 and 7 by adhesive, prepreg, fasteners or other suitable mechanism 15 shown in FIGS. 1A and 1B. The middle plate 13 can have a top surface 21 that is optionally planar (e.g., flat), as shown in FIGS. 4A, 4B, 5A and 5B. Optionally, the top plate 12 can be parallel to the middle plate 13.

The middle plate 13 is optionally coupled to the bottom plate 14 in FIGS. 1A, 1B, 4A, 4B, 5A, 5B, 6 and 7 by an adhesive, prepreg, fasteners or other suitable mechanism 16 as shown in FIGS. 1A and 1B, or another mechanism (e.g. welds). The sectional view of 16 is shown in FIGS. 2A, 2B, 3A, 3B, 8A and 8B. Optionally, the middle plate 13 can be parallel to the bottom plate 14.

The bottom plate 14 is optionally coupled to the middle plate 13 by adhesive, prepreg, fasteners or other suitable mechanism 16, as shown in FIGS. 1A, 1B, 4A, 4B, 5A and 5B, or other means (e.g., welds). The bottom plate 14 can have a top surface 40 that is optionally planar (e.g., flat), as shown in FIGS. 6 and 7.

Optionally, the top plate 12 can be removably or permanently coupled to the middle plate 13, by an adhesive 15 or other suitable mechanism (e.g., prepreg, fasteners, welds), as shown in FIGS. 2A, 2B, 3A, 3B, 8A and 8B. Optionally, the bottom plate 14 can be removably or permanently coupled to the middle plate 13 by an adhesive 16 or other suitable mechanism (e.g., prepreg, fasteners, welds, etc.).

The embodiment of the storage chamber 50 is formed by a top surface perimeter outline 51 shown in FIGS. 4A, 4B, 5A, 5B, 6 and 7 and a bottom surface perimeter outline 53 shown in FIGS. 4A, 4B, 6 and 7 connected by a side wall 52 shown in FIGS. 4A, 4B, 6 and 7. The storage chamber 50 can optionally be filled with air in addition to the one or more particles (e.g., tungsten balls) 30. Alternatively, the storage chamber 50 can be under vacuum. In another alternative, the storage chamber 50 can be filled with another gas, such as an inert gas.

Figure 2A:
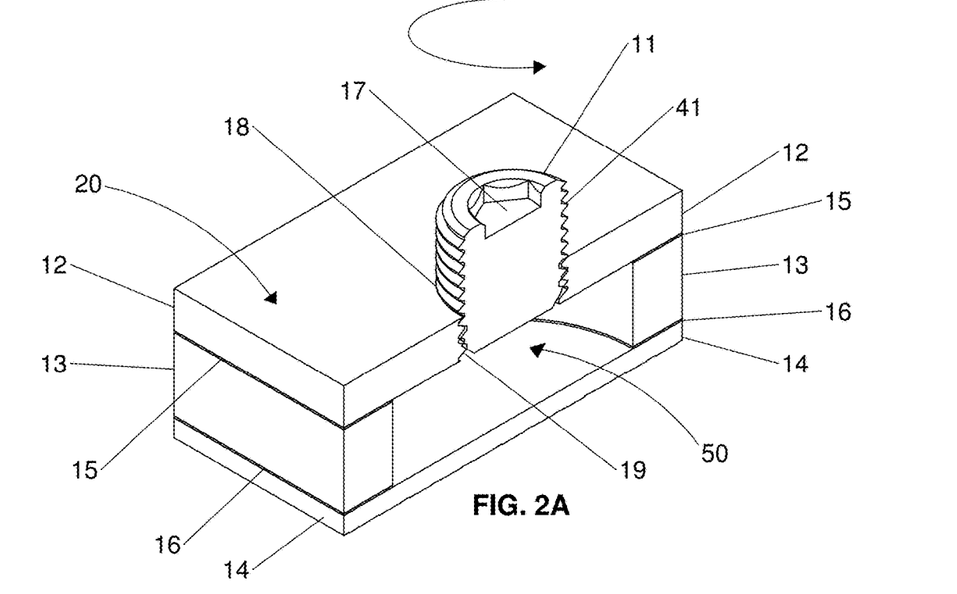
FIG. 2A is an isometric cross sectional view of the apparatus of FIG. 1A with the adjustable screw withdrawn from the cavity. The cavity is shown empty without a plurality of tungsten balls for clarity.
Figure 3A:
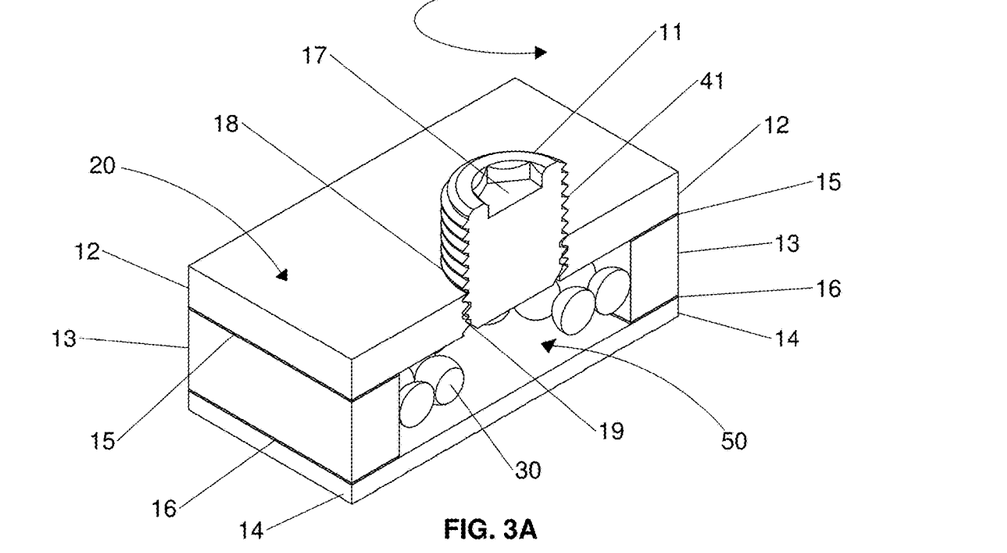
FIG. 3A is an isometric cross sectional view of the apparatus of FIG. 2A with the adjustable screw withdrawn from the cavity. The cavity is shown filled with a plurality of tungsten balls.
Figure 8A:
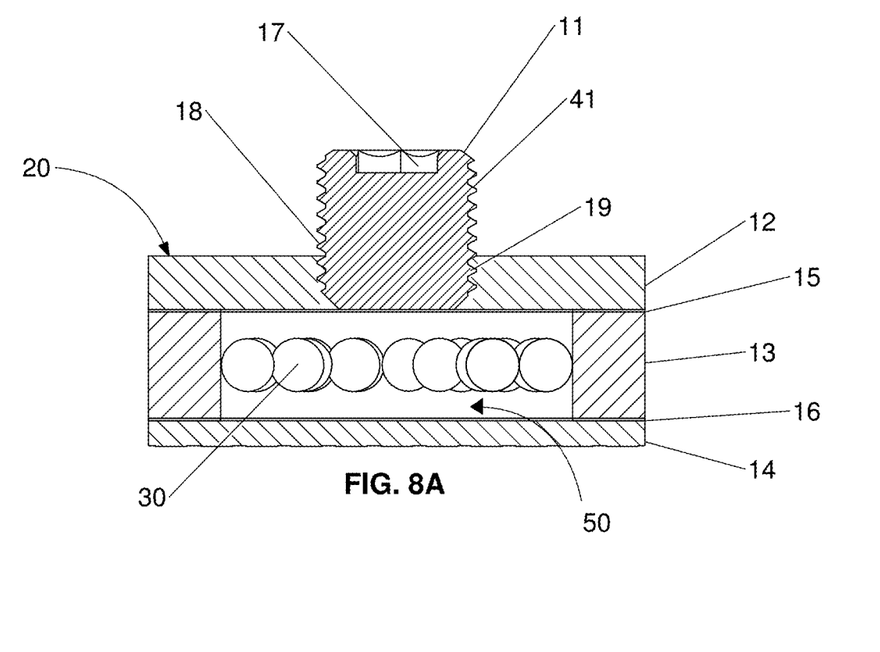
FIG. 8A is a front facing section view of FIG. 3A.

The sectional view of the storage chamber 50 is shown in FIGS. 2A, 3A and 8A.

The maximum volumetric capacity of the storage chamber 50 is formed when the adjustment screw 11 is fully withdrawn (removed) from the storage chamber.

The minimum volumetric capacity of the storage chamber 50 is designated as 54 when the adjustment screw 11 is fully inserted into the storage chamber as shown in FIGS. 4A, 5A and 7. In other words, the storage chamber is designated as 50 whenever the adjustment screw 11 is fully withdrawn (e.g., removed) from the storage chamber and the storage chamber is designated as 54 whenever the adjustment screw 11 enters (e.g., is present at any place inside of) the storage chamber.

Figure 2B:
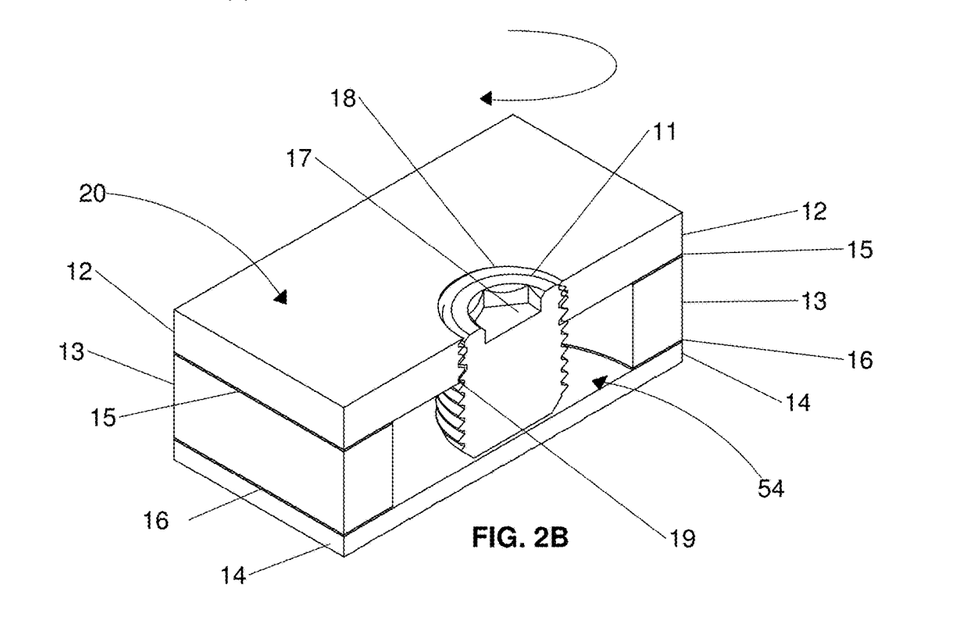
FIG. 2B is an isometric cross sectional view of the apparatus of FIG. 1B with the adjustable screw fully inserted into the cavity. The cavity is shown empty without a plurality of tungsten balls for clarity.
Figure 3B:
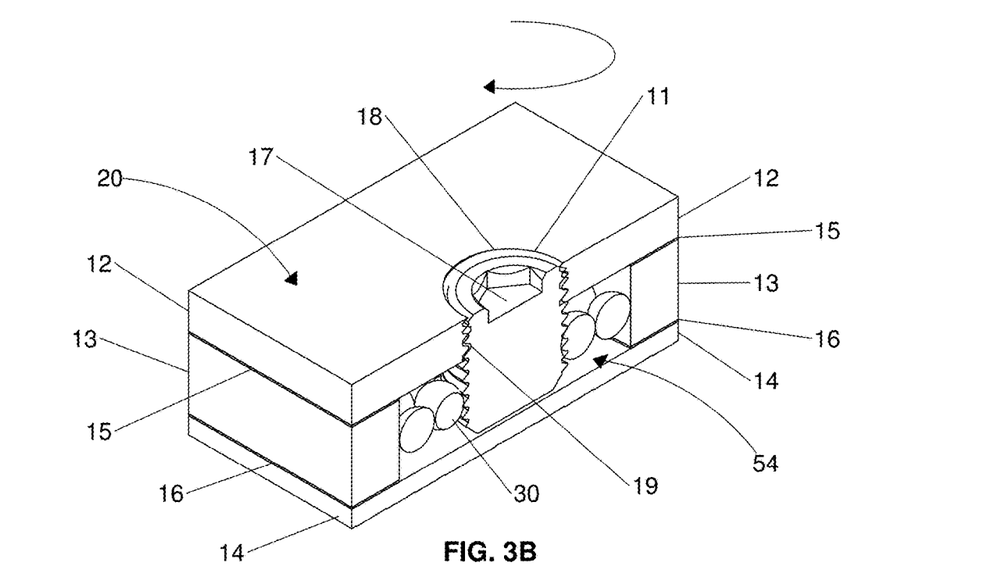
FIG. 3B is an isometric cross sectional view of the apparatus of FIG. 2B with the adjustable screw fully inserted into the cavity. The cavity is shown filled with a plurality of tungsten balls.
Figure 8B:
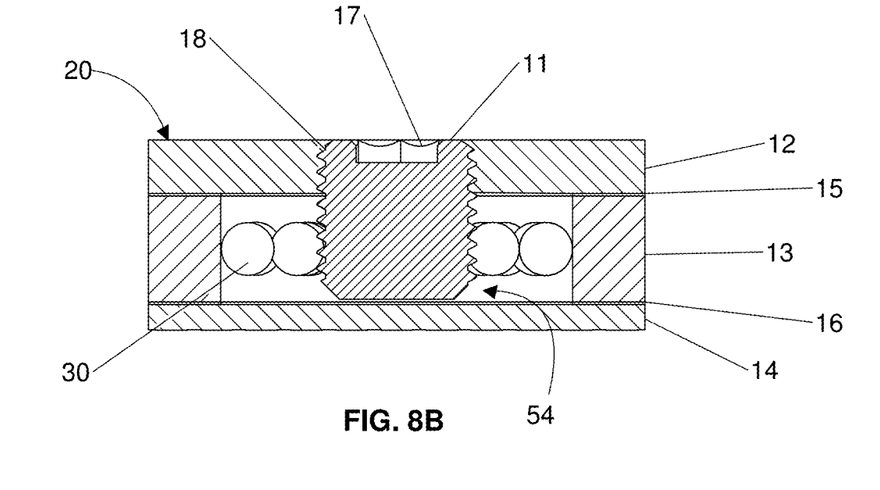
FIG. 8B is a front facing section view of FIG. 3B.

The sectional view of the storage chamber 54 is shown in FIGS. 2B, 3B and 8B.

The minimum volumetric capacity of the storage chamber 54 is formed when the adjustment screw 11 is fully inserted into the storage chamber.

The volumetric capacity of the storage chamber 54 is continuously adjustable (e.g., tunable) through a full range by withdrawing the adjustment screw 11 fully out of the storage chamber 50 or by inserting the adjustment screw 11 fully into the storage chamber 54, or any partially adjusted setting therefrom.

Adjustment (e.g., tuning) the volumetric capacity of the storage chamber 54 advantageously allows the control of the effective mass and travel displacement of tungsten balls 30 inside the PID container 10 without the need to physically add or remove tungsten balls or other forms of stored payload, thereby adjusting (e.g., tuning) the damping effect provided by the PD.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A particle impact damper for use with printed circuit boards, comprising:
    a housing defining a chamber bounded by a plurality of surfaces;
    a plurality of particles disposed in the chamber and configured to move within the chamber;
    one or more threaded holes defined in one or more walls of the housing; and
    one or more threaded screws configured to be threadably inserted into the one or more threaded holes to seal the threaded holes, the one or more threaded screws being selectively adjustable to vary a distance the one or more threaded screws extend into the chamber, the one or more threaded screws configured to extend from a first position where the one or more threaded screws do not protrude into the chamber while being threadably coupled to the one or more threaded holes and a second position where the one or more threaded screws are fully inserted in the chamber and interposed between the plurality of particles, wherein adjusting the distance the one or more threaded screws extend into the chamber adjusts and tunes a volumetric capacity of the chamber and an effective mass and travel displacement of the plurality of particles in the chamber to thereby vary a damping performance of the particle impact damper.

2. The particle impact damper of claim 1, wherein the housing has one of a cube shape, a rectangular cuboid shape, a toroidal shape, and a cylindrical shape.

3. The particle impact damper of claim 1, wherein said chamber has one of a cuboid, rectangular cuboid, cylindrical, and toroidal shape.

4. The particle impact damper of claim 1, wherein the housing comprises one of a plastic, a ceramic, and a metal material.

5. The particle impact damper of claim 1, wherein the one or more threaded screws are a plurality of threaded screws.

6. The particle impact damper of claim 1, wherein the one or more threaded holes has a diameter larger than a diameter of the plurality of particles.

7. In combination with a printed circuit board, a particle impact damper comprising:
a housing defining a storage chamber therein;
a plurality of balls disposed in the storage chamber and configured to move within the storage chamber;
one or more threaded holes defined through one or more walls of the housing; and
one or more threaded screws configured to be inserted into the one or more threaded holes to seal the threaded holes, the one or more threaded screws being selectively adjustable to vary a distance the one or more threaded screws extend into the storage chamber, the one or more threaded screws configured to extend from a first position where the one or more threaded screws do not protrude into the storage chamber while still threadably coupled to the one or more threaded holes and a second position where the one or more threaded screws are fully inserted in the storage chamber and interposed between the plurality of balls,
wherein adjusting the distance the one or more threaded screws extend into the storage chamber adjusts and tunes a volumetric capacity of the storage chamber and an effective mass and travel displacement of the plurality of balls in the storage chamber to thereby vary a damping performance of the particle impact damper on the printed circuit board.

8. The combination of claim 7, wherein the housing has one of a cube shape, a rectangular cuboid shape, a toroidal shape, and a cylindrical shape.

9. The combination of claim 7, wherein said storage chamber has one of a cuboid, rectangular cuboid, cylindrical, and toroidal shape.

10. The combination of claim 7, wherein the housing comprises one of a plastic, a ceramic, and a metal material.

11. The combination of claim 7, wherein the one or more threaded holes has a diameter larger than a diameter of the plurality of balls.

12. The combination of claim 7, wherein the plurality of balls comprise tungsten.

13. The combination of claim 7, wherein the housing comprises a top plate, a middle plate and a bottom plate coupleable to each other to define the housing, the storage chamber defined at least in part by a cavity in the middle plate.

* * * * *

UNITED STATES PATENT AND TRADEMARK OFFICE
CERTIFICATE OF CORRECTION

PATENT NO. : 10,041,558 B1
APPLICATION NO. : 15/727371
DATED : August 7, 2018
INVENTOR(S) : Martin B. Hart Page 1 of 1

It is certified that error appears in the above-identified patent and that said Letters Patent is hereby corrected as shown below:

In the Specification

On Column 5, Line 25: Change "FIG." to --FIGS.--.

On Column 6, Line 60: Change "PD." to --PID.--.

Signed and Sealed this
Thirteenth Day of November, 2018

Andrei Iancu
*Director of the United States Patent and Trademark Office*